United States Patent [19]
Gourse et al.

[11] Patent Number: 5,488,313
[45] Date of Patent: Jan. 30, 1996

[54] TEST PROBE AND CIRCUIT BOARD ARRANGEMENT FOR THE CIRCUIT UNDER TEST FOR MICROSTRIP CIRCUITRY

[75] Inventors: Stanley J. Gourse, Highland; Eugene Fischer, Upper Marlboro; George A. Harrison, Pasadena, all of Md.

[73] Assignee: Litton Systems, Inc., Woodland Hills, Calif.

[21] Appl. No.: 92,616

[22] Filed: Jul. 16, 1993

[51] Int. Cl.⁶ .................................................. G01R 1/06
[52] U.S. Cl. ........................................... 324/754; 324/755
[58] Field of Search ............................. 324/158 F, 158 P, 324/72.5, 73.1, 158.1, 754, 765; 439/482; 371/15.1; 333/246, 248, 204, 205

[56] References Cited

U.S. PATENT DOCUMENTS

| | | | |
|---|---|---|---|
| 4,749,942 | 6/1988 | Sang et al. | 324/158 P |
| 4,849,689 | 7/1989 | Gleason et al. | 324/158 F |
| 4,853,624 | 8/1989 | Rabjohn | 324/158 F |
| 4,853,627 | 8/1989 | Gleason et al. | 324/158 F |
| 4,871,964 | 10/1989 | Boll et al. | 324/158 F |
| 4,894,612 | 1/1990 | Drake et al. | 324/158 F |
| 5,028,863 | 7/1991 | Negle | 324/158 P |
| 5,075,630 | 12/1991 | Babbitt et al. | 324/158 F |

*Primary Examiner*—Vinh P. Nguyen
*Attorney, Agent, or Firm*—Gerard L. Lett

[57] ABSTRACT

A wide band radio frequency measurement probe assembly is described for use in connection with circuits constructed of microstrip circuitry. The probe includes a resistive voltage divider connected to a microstrip transmission line enclosed in a hand held housing. Ground points for engagement with ground contacts on the probe are provided on the circuit board substrate and are plated through to a ground plane on the other side of the substrate.

2 Claims, 6 Drawing Sheets

TEST PROBE AND CIRCUIT BOARD ARRANGEMENT FOR THE CIRCUIT UNDER TEST FOR MICROSTRIP CIRCUITRY

FIELD OF THE INVENTION

This invention relates to apparatus for monitoring the circuit operation of microstrip circuitry. More particularly, the invention relates to a probe-type device capable of operating over a wide band of frequencies and a circuit arrangement for accommodating the probe which has little effect on the operating characteristics of the circuit under test.

BACKGROUND OF THE INVENTION

Many circuit boards designed to operate in the microwave range of frequencies are implemented using microstrip circuitry. Microstrip circuits are characteristically difficult to test because the circuit must be designed to include points at which a test probe can be accepted, and it has been the case that these test points themselves have had a measurable effect on the operation of the circuit.

Special provisions must be made to accommodate measurement of the electrical parameters of a signal being carried by a microstip circuit. Such special provisions have included power dividers or directional couplers. In many circuits of this type, it is necessary to be able to monitor a wide range of frequencies so that if a directional coupler is used for this purpose, the directional coupler will occupy a relatively large area on the circuit board. In the design of such circuits, size and weight are always at a premium and consequently, the space is frequently not available for the desired test points. Wide band resistive power dividers have been used as well. These are smaller, but they introduce at least a 6 db insertion loss in the circuit being tested.

It is therefore, an object of this invention to provide a radio frequency test probe device for microstrip circuitry that is usable over a very wide frequency range, such as, for example, DC to 18 GHz.

Another object of this invention is to provide such a test probe and an arrangement for accommodating the test probe on a microstrip circuit board which will require that very little of the circuit board area be used for purposes of accommodating the probe's requirements.

Still another object of this invention is to provide a test probe arrangement of the foregoing variety which introduces very low loss in the circuit being tested when in operation and no loss when not in use.

SUMMARY OF THE INVENTION

The foregoing and other objects are obtained in a probe type device including a resistive voltage divider mounted in a transmission line which itself forms a part of the probe. In order to provide for the necessary connection to the ground plane on the opposite surface of the circuit substrate, sets of electrically conductive pads plated through the substrate are provided. These pads need only be as large as necessary to provide electrical contact with a small ground terminal on the probe. Thus, a negligible amount of space on a circuit board is needed to accommodate the probe, and these pads introduce no measurable loss when the probe is not being used. Moreover, the microstrip line/resistive voltage divider probe provide excellent coupling characteristics with the circuit being measured.

BRIEF DESCRIPTION OF THE DRAWINGS

The principles of this invention will be most readily understood by reference to the description of a preferred embodiment given herein below along with reference to the accompanying drawings, which are briefly described as follows.

DETAILED DESCRIPTION OF THE PREFERRED EMBODIMENT

Figure 1:
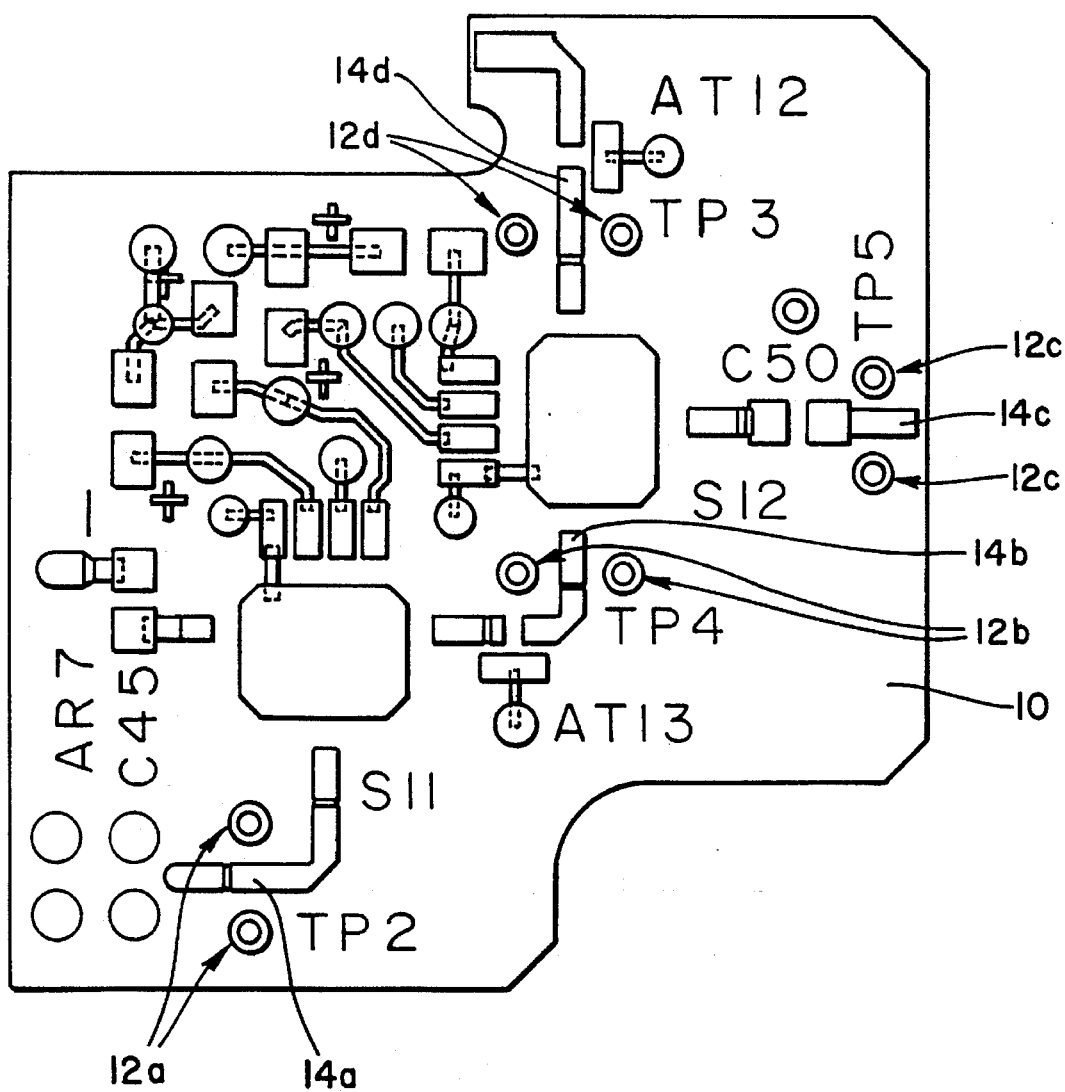
FIG. 1 is a top elevational view of a typical microstrip circuit board modified in accordance with the principles of the invention to provide test points for the probe which is the subject of this invention.
Figure 7:
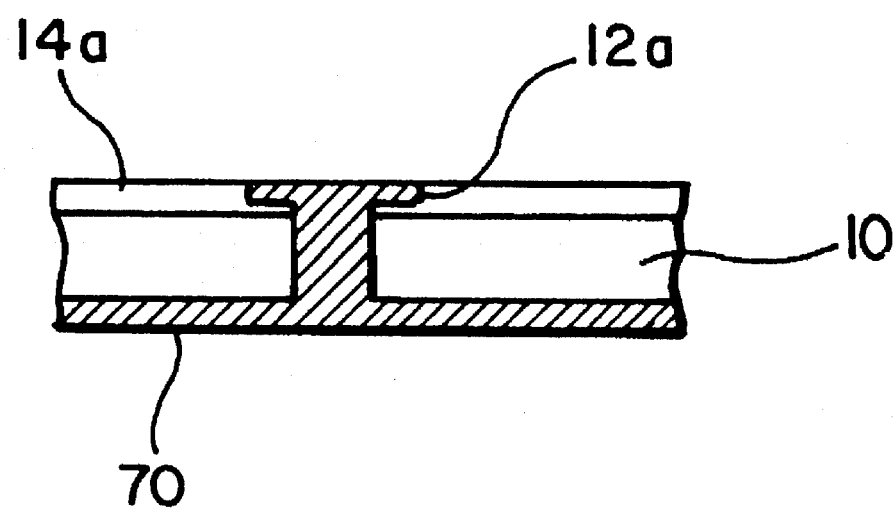
FIG. 7 is a side partial cross sectional view taken along the line 7—7 of the FIG. 1 embodiment.

FIG. 1 is a top elevational view of a typical circuit board carrying microstrip circuitry which is constructed to use the probe of the invention. Circuit board 10 formed in the conventional manner from a dielectric substrate is shown in this example to have four pairs of ground pads or test points respectively identified as 12a, 12b, 12c and 12d. Each ground pad forming one of the pair is conductive and is plated through to a ground plane 70 on the bottom surface of the circuit board 10 (see FIG. 7). It is contemplated by this invention that the operation of the circuit may be monitored wherever these pads are located. It may be seen that very little surface area is required for each ground pad, which in this example is 0.045 inch in diameter.

It will be seen, for example, that the pair 12a of ground pads is adjacent a length of microstrip circuitry 14a which will be engaged by the probe in the manner to be described herein below. Similarly, pairs of ground pads 12b, 12c and 12d are adjacent, respectively, lengths of microstrip circuitry 14b, 14c and 14d where the probe will be placed for monitoring predetermined circuit characteristics. It will be appreciated that pairs of ground pads may be placed anywhere on the circuit where they would be adjacent a length of microstrip circuitry, where it is desired to make electrical measurements concerning the operation of the circuit and where they are spaced from the microstrip line in accordance with the dimensions of the probe to be used.

Figure 2:
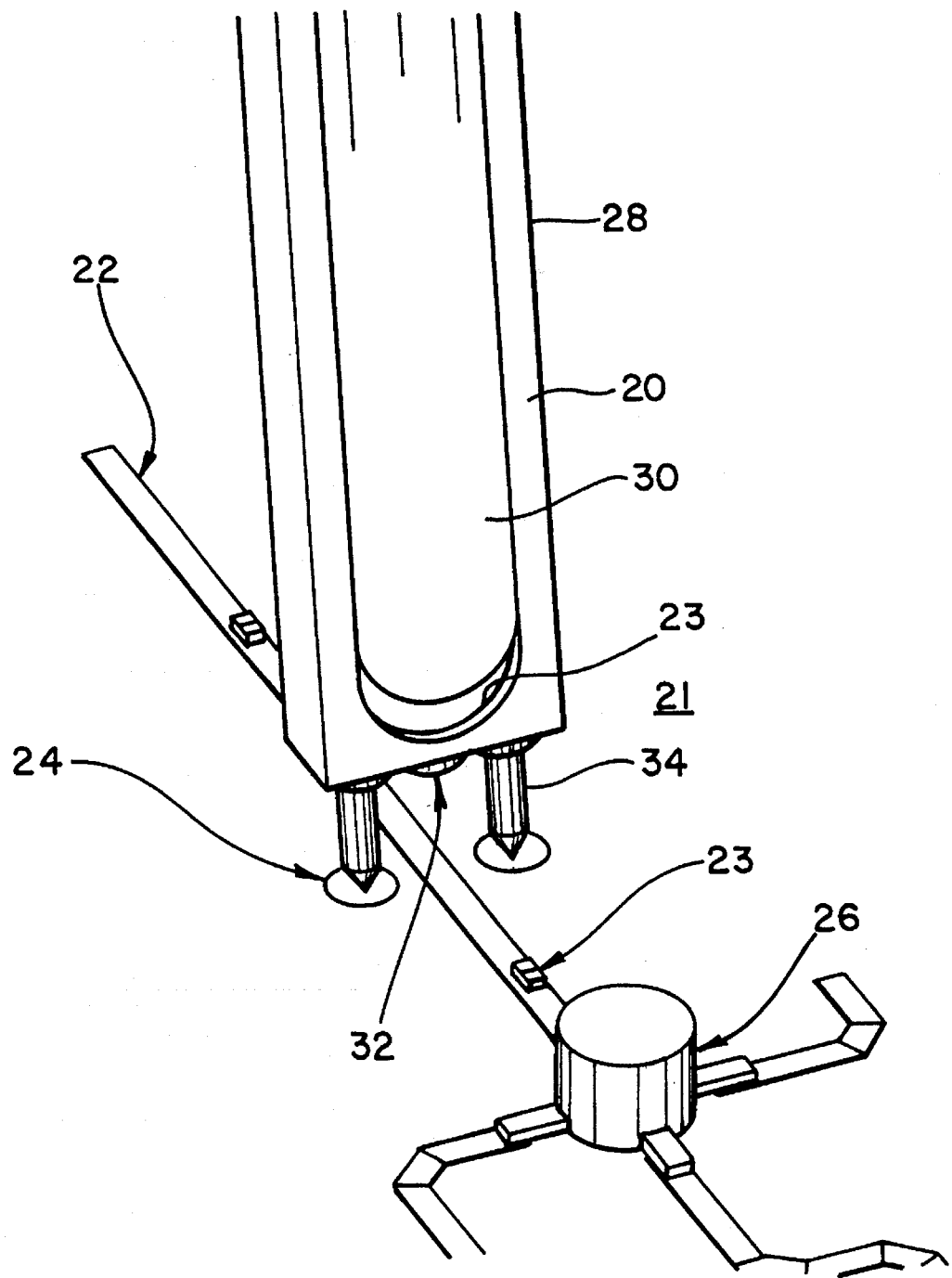
FIG. 2 is a perspective view of a probe type device constructed according to the principles of the invention wherein is illustrated the probe being placed in engagement with a typical microstrip circuit for testing that circuit.

FIG. 2 is a perspective view of a probe assembly 20 constructed according to the principles of the invention. This figure also illustrates an exemplary length of microstrip circuit 22; in this case the microstrip 22 terminates in an amplifier 26 and includes coupler capacitors 23. Ground pads 24 are plated through a substrate 21 as described herein above in connection with FIG. 1.

Probe assembly 20 comprises a machined housing 28 shaped roughly like a pencil. A slot 23 is milled along the length of the probe housing to accommodate a length of microstrip transmission line 30 which is terminated at the upper end of the probe (not shown) in the center conductor of a connector, such as, for example, an SMA connector (also not shown). The latter connector may be used to connect the probe to a measuring instrument, such as a spectrum analyzer, a power meter or the like. Housing 28 is constructed of a conductive material, the upper end of which is connected to the ground connection of the SMA conductor.

At its other end, the microstrip transmission line 30 terminates at the lower end of housing 28 in a metallic probe contact 32. The latter is designed to be placed in engagement with the microstrip circuit 22 for purposes of making measurements. Ground contacts 34 are embedded in the lower end of the housing 28, as well. In this figure, the probe assembly 20 is shown as being placed on ground pads 24 and over the length of microstrip circuit 22, but not yet in full engagement with those elements to begin measurements.

Figure 4:
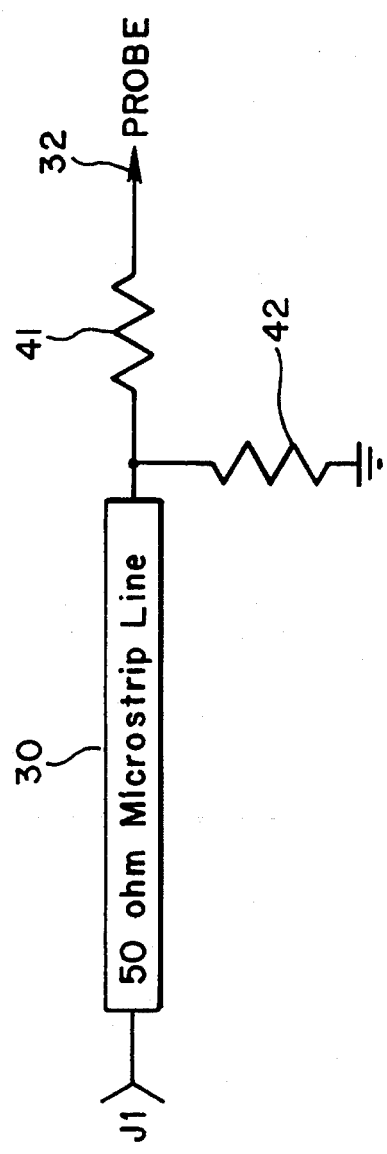
FIG. 4 is a schematic circuit diagram of the FIGS. 2 and 3 probe type device.

FIG. 4 illustrates in schematic form the electrical circuit formed by probe assembly 20. Probe contact 32 is connected to a voltage divider formed by resistors 41 and 42. Resistor 41 connects probe 32 to the above mentioned length of microstrip line 30 in the probe assembly which in turn is connected to a connector illustrated as J1. Resistor 42 is connected from the junction of resistor 41 and microstrip line 30 to ground.

Figure 3:
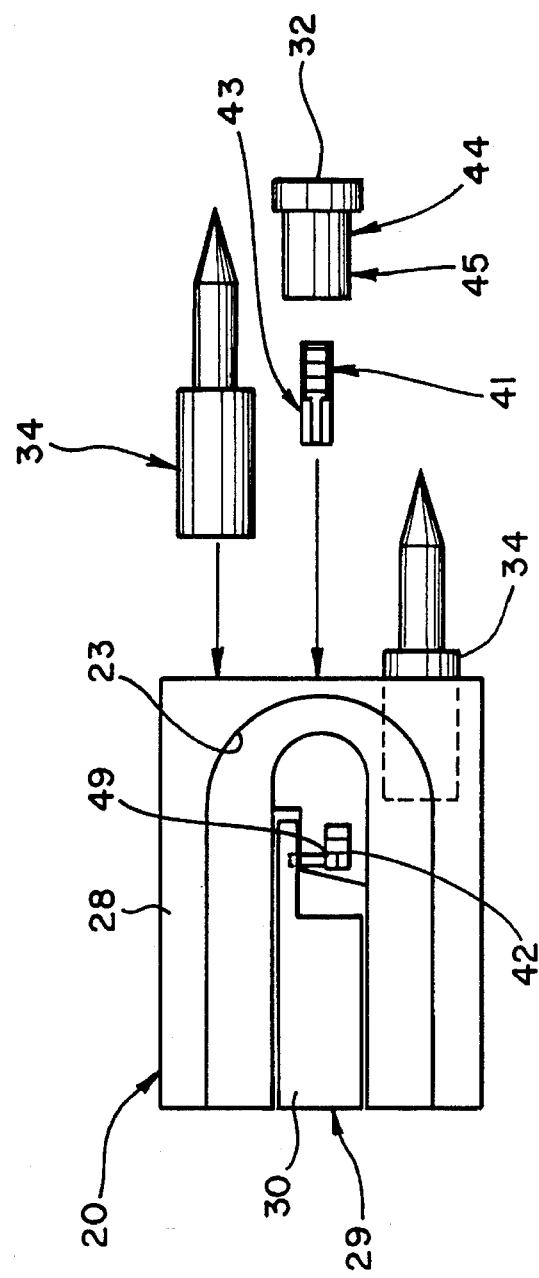
FIG. 3 is a partial cross section and exploded view of the FIG. 2 probe type device.

Referring to FIG. 3 there is shown a partial side cross sectional view of the active or lower end of probe assembly 20. While housing 28 is machined from a conductive material, such as in this case brass, any such material may be used. Within the slot 23, formed as shown, there is placed a non conductive substrate 29, and in this example, the material is Duroid. This, of course, electrically isolates the length of microstrip line 30 from ground.

A pair of spring loaded ground contact assemblies 34 are fit within this active end of the probe on either side of probe tip 32. These may be made from the same conductive material as is housing 28.

As described in FIG. 4 below, probe contact 32 is connected to microstrip line 30 via a resistor 41 which is formed in a ceramic substrate 43. It should be pointed out, as well, that probe contact 32 is formed as shown from a conductive material, and it rests on a diode pillbox type housing 44 which also includes a ceramic substrate 45 to carry resistor 41. Resistor 41, when inserted in housing 44 is soldered to the inside surface of probe tip 32. When probe contact housing 44 is inserted in the probe housing 28, as shown, the inner end of resistor 41 contacts and may be soldered to the outer termination of resistor 42. At this terminal 49, resistor 42 is connected from ground as formed by the probe housing 28 to the microstrip line 30.

In order to make a measurement probe assembly 20 is placed adjacent a length of microstrip circuitry, such as the microstrip 22, and placed so that ground contacts 34 engage ground pads 24. Further manual pressure on the probe assembly 20 allows probe contact 32 to engage with the microstrip line 22 so that electrical measurements can be made.

Figure 6:
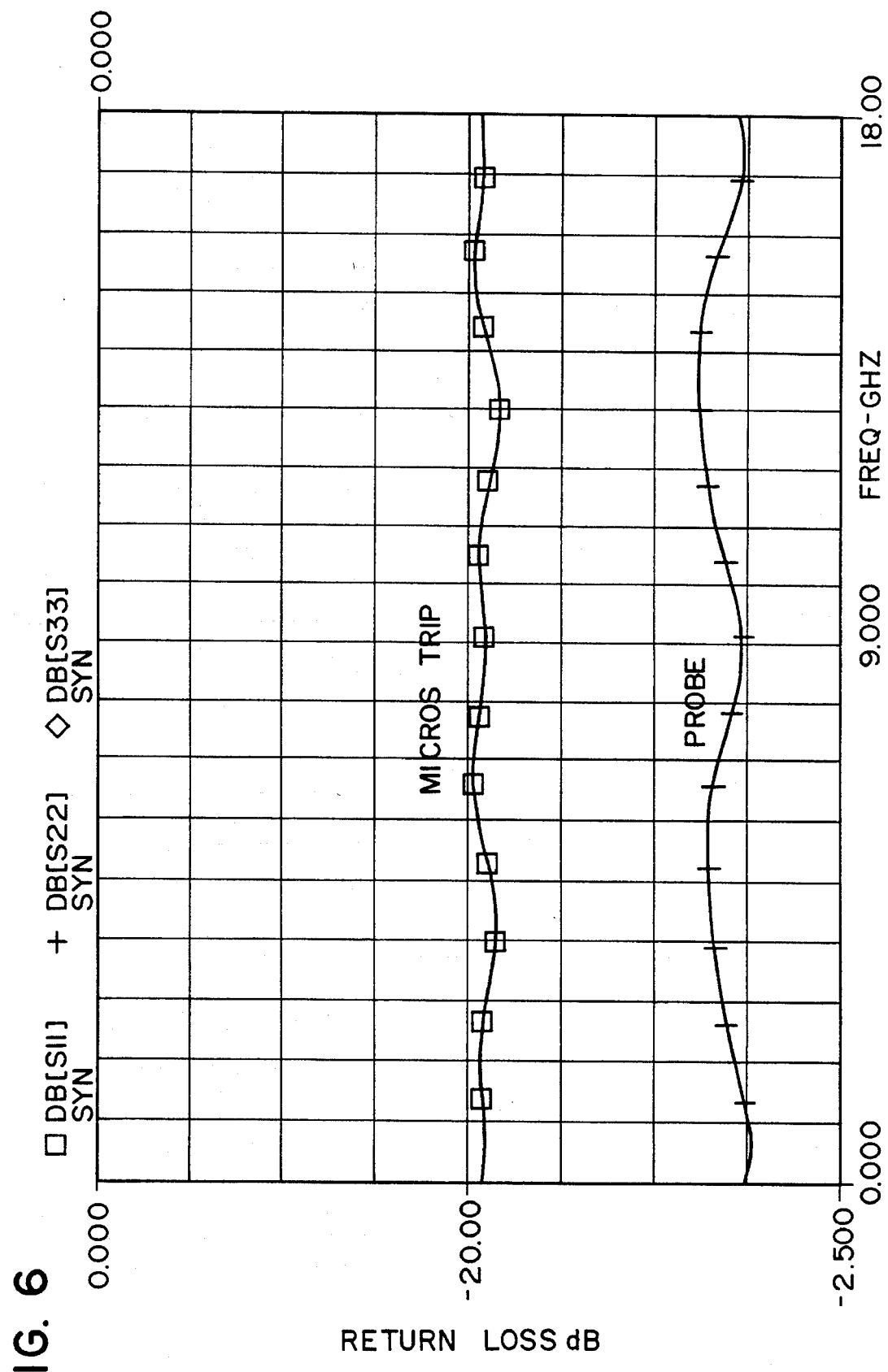
FIG. 6 is a return loss versus frequency curve of the FIGS. 2 and 3 probe as it relates to the microstrip being measured.

When probe tip 32 is in contact with microstrip line to carry out a measurement, an excellent impedance match occurs. As shown in FIG. 6, across the frequency band of interest (0 to 18 GHz), there is less than 20 db return loss.

Figure 5:
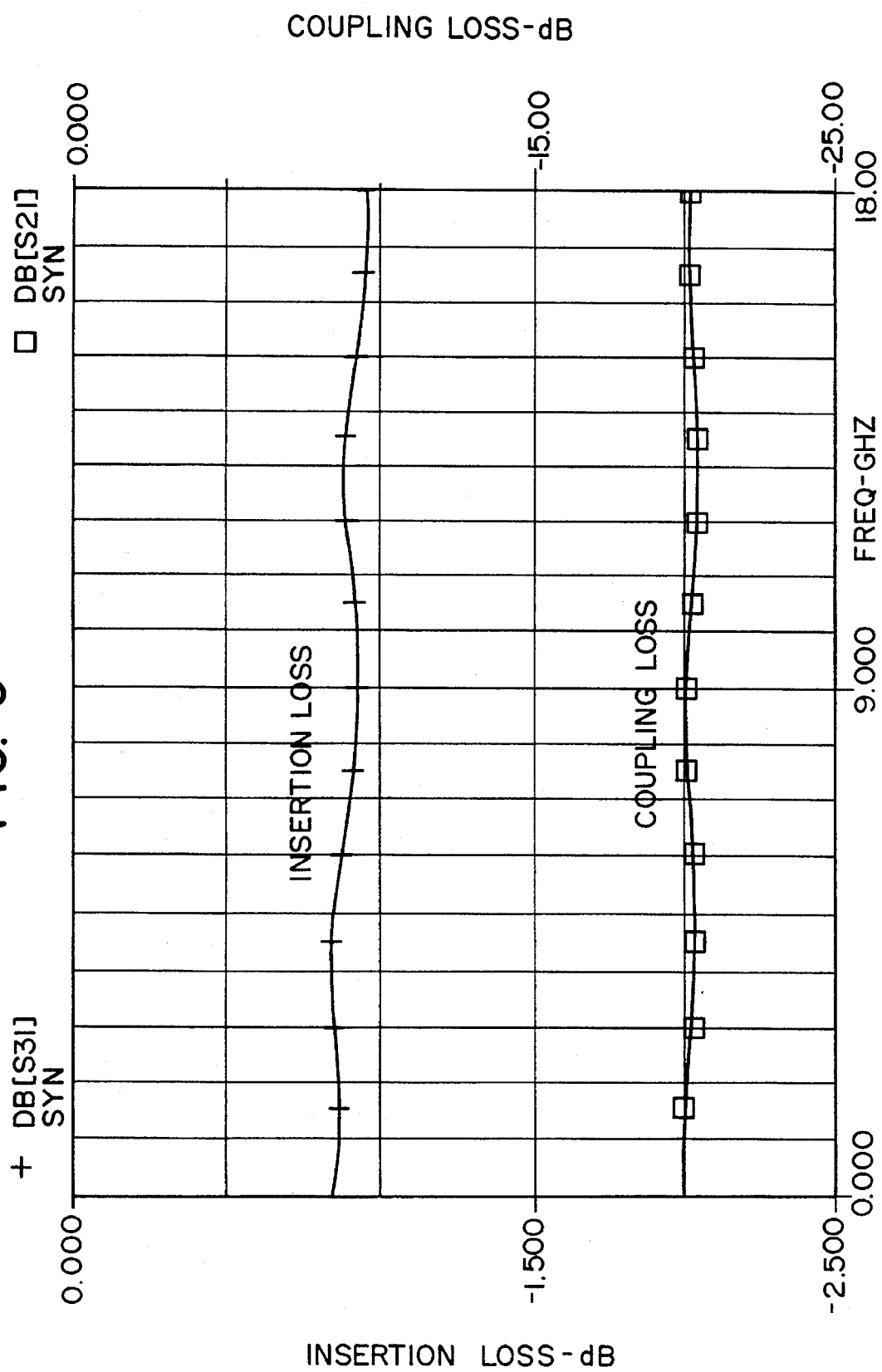
FIG. 5 is an insertion loss and coupling loss versus frequency graph illustrating the performance of the probe constructed according to principles of the invention.

FIG. 5 shows the insertion and coupling loss with the probe contacting the microstrip line. Insertion loss is less than 1 db over the frequency range of interest and coupling loss is substantially only 20 db. While not shown herein, in some applications, it may be necessary to place a capacitor in series with probe tip 32 to act as a DC block isolating the probe from any DC bias applied to the circuit under test. This capacitor might be a part of the ceramic substrate containing resistor 41. The addition of this blocking capacitor will limit the low frequency response of the probe, but operation at microwave frequencies will be unaffected.

The principles of this invention have been described by describing the construction and operation of a preferred embodiment using those principles. It will be appreciated that the described embodiment might be changed or modified without departing from the scope of the invention as defined by the appended claims.

We claim:

1. An arrangement for sensing the electrical characteristics of a signal being carried on a microstrip circuit, wherein the microstrip circuit is mounted on a dielectric substrate having a ground plane on one surface thereof and a microstrip electrical circuit on the other, the arrangement comprising:

at least one electrically conductive test point extending from and electrically connected to said ground plane through said substrate to said other surface adjacent said microstrip circuit at a point thereon where it is desired that electrical measurements be made, a probe housing having a length of microstrip line extending from an end thereof the length of the probe housing to a connector means connectable to an external measuring device, a contact element carried on said end of said probe housing and adapted to be placed in contact with and electrically coupled to said length of microstrip line for engaging with the microstrip circuit and ground contact means carried on said probe housing for engagement with said test point and electrically connected through said probe housing to said connector means.

2. The arrangement for sensing the electrical characteristics of a signal being carried on a microstrip circuit defined in claim 1, further comprising:

a voltage divider connecting said length of microstrip line extending the length of said probe housing to said contact element.

\* \* \* \* \*